United States Patent
Patel et al.

(10) Patent No.: US 10,530,182 B2
(45) Date of Patent: Jan. 7, 2020

(54) UPS POWER FAILURE DETECTION

(71) Applicant: Toshiba International Corporation, Houston, TX (US)

(72) Inventors: Jigarkumar Lakshmanbhai Patel, Houston, TX (US); Stephen Hallacy, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 299 days.

(21) Appl. No.: 15/373,094

(22) Filed: Dec. 8, 2016

(65) Prior Publication Data

US 2018/0166913 A1    Jun. 14, 2018

(51) Int. Cl.
*H02J 9/06* (2006.01)
*G01R 19/02* (2006.01)

(52) U.S. Cl.
CPC ............... *H02J 9/06* (2013.01); *G01R 19/02* (2013.01)

(58) Field of Classification Search
CPC ..... H02J 9/06; G01R 19/16547; G01R 19/02; G01R 31/40
See application file for complete search history.

(56) References Cited

U.S. PATENT DOCUMENTS

| | | | | |
|---|---|---|---|---|
| 6,051,893 A * | 4/2000 | Yamamoto | ............... | H02J 9/06 307/43 |
| 6,330,176 B1 * | 12/2001 | Thrap | ............... | H02J 3/005 307/86 |
| 7,432,615 B2 * | 10/2008 | Hjort | ............... | H02J 9/062 307/64 |
| 8,110,946 B2 * | 2/2012 | Morishima | ............... | H02J 9/061 307/64 |
| 8,299,648 B2 * | 10/2012 | Morishima | ............... | H02J 9/00 307/66 |
| 8,606,425 B2 * | 12/2013 | Morishima | ............... | H02J 9/062 307/66 |
| 8,772,969 B2 * | 7/2014 | Jung | ............... | H02J 9/061 307/86 |
| 2009/0195212 A1 * | 8/2009 | Chiasson | ............... | G01R 31/392 320/136 |
| 2015/0333566 A1 * | 11/2015 | Berard | ............... | H02J 3/1842 307/64 |
| 2018/0054084 A1 * | 2/2018 | Paatero | ............... | H02J 9/00 |

* cited by examiner

*Primary Examiner* — Jared Fureman
*Assistant Examiner* — Michael J Warmflash
(74) *Attorney, Agent, or Firm* — Baker Botts L.L.P.

(57) ABSTRACT

In accordance with presently disclosed embodiments, uninterruptable power supplies and a method for detecting power failures for a UPS are provided. In one embodiment, the method comprises: detecting at least a portion of a waveform of a primary power input of an uninterruptable power supply; calculating at least one of a detected voltage value and a detected current value, based, at least in part, on the detected waveform by calculating at least one of a root mean square, an average, or a summation of the detected waveform; and transferring the uninterruptable power supply to a secondary power input in response to at least one of the following conditions: the detected voltage value is lower than a minimum threshold voltage value, the detected voltage value is higher than a maximum threshold voltage, or the detected current value is higher than an over current value.

17 Claims, 3 Drawing Sheets

UPS POWER FAILURE DETECTION

TECHNICAL FIELD

Embodiments of the present disclosure relate to power failure detection and, more particularly, to the detection of power failures or abnormalities in uninterruptable power supplies.

BACKGROUND

An uninterruptible power supply, well known as a UPS, is typically used as a buffer between commercially supplied power and an electrical load. A UPS typically monitors the supplied power and will transfer to a backup mode if it detects a power failure or an abnormal voltage or current. During the transfer between the main power supply and the backup mode, energy is typically provided by a DC Bus comprising a capacitor. The amount of capacitance needed depends, in part, on how quickly the power failure or abnormal voltage is detected. Higher capacitance capacitors tend to be more expensive and take up more space in the UPS.

SUMMARY

In accordance with the above, presently disclosed embodiments are directed to uninterruptable power supplies and methods of detecting power failures or abnormalities for uninterruptable power supplies.

As used herein, "waveform" means the shape and/or form of a signal. For example, in certain embodiments, a waveform may comprise the shape and/or form of the current or voltage of an AC power source. As used herein, "detecting a waveform" means detecting at least one characteristic of at least a portion of a waveform. For example, detecting a waveform may comprise detecting at least one of period, frequency, amplitude, phase, wavelength, or any other suitable waveform characteristic of at least a portion of a waveform.

In some embodiments, a method may comprise detecting a waveform of a primary power input of an uninterruptable power supply, wherein the detected waveform is less than a half-cycle of the waveform of the primary power input. In some embodiments, the detected waveform is a quarter-cycle or less of the waveform of the primary power input. In certain embodiments, at least one of a detected voltage value and a detected current value may be calculated based, at least in part, on the detected waveform by calculating at least one of a root mean square, an average, or a summation of the detected waveform. In some embodiments, the uninterruptable power supply may be transferred to a secondary power input in response to at least one of the following conditions: the detected voltage value is lower than a minimum threshold voltage value, the detected voltage value is higher than a maximum threshold voltage, or the detected current value is higher than an over current value.

In certain embodiments, an uninterruptable power supply may comprise a primary power input, a secondary power input, an input voltage detection circuit, a current detection circuit, a DC bus, and a control circuit. In some embodiments, the input voltage detection circuit may detect the voltage waveform of a primary power input. In some embodiments, the current detection circuit may detect the current waveform of the primary power input. In certain embodiments, the DC bus may comprise a main capacitor module for supplying energy during a transfer between the primary power input and the secondary power input. In some embodiments, the control circuit may be configured to use at least one of the input voltage detection circuit and the current detection circuit to detect at least a portion of a waveform of the primary power input, wherein the detected waveform is less than a half-cycle of the waveform of the primary power input. In certain embodiments, the control circuit may be configured to calculate at least one of a detected voltage value and a detected current value based, at least in part, on the detected waveform by calculating at least one of a root mean square, an average, or a summation of the detected waveform. In some embodiments, the control circuit may be configured to transfer the uninterruptable power supply to the secondary power input in response to at least one of the following conditions: the detected voltage value is lower than a minimum threshold voltage value, the detected voltage value is higher than a maximum threshold voltage, or the detected current value is higher than an over current value.

BRIEF DESCRIPTION OF THE DRAWINGS

For a more complete understanding of the present disclosure and its features and advantages, reference is made to the following description, taken in conjunction with the accompanying drawings, in which.

DETAILED DESCRIPTION

Illustrative embodiments of the present disclosure are described in detail herein. In the interest of clarity, not all features of the actual implementation are described in this specification. It will of course be appreciated that in the development of any such embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of this disclosure. Furthermore, in no way should the following examples be read to limit or define the scope of the disclosure.

Figure 1:
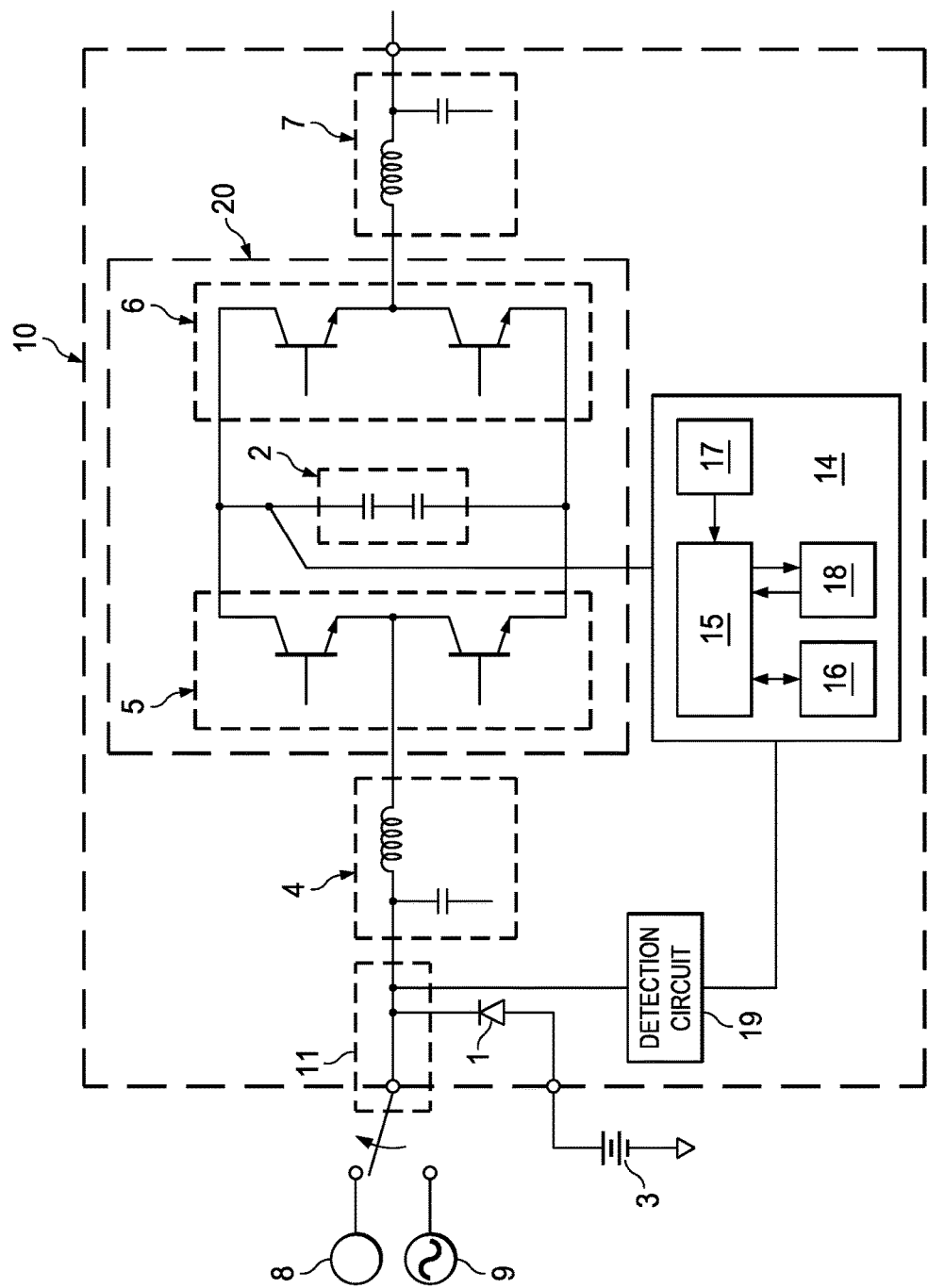
FIG. 1 is a circuit schematic of an uninterruptible power supply system in accordance with an embodiment of the present disclosure.

Turning now to the drawings, FIG. 1 illustrates an embodiment of an uninterruptable power supply 10 comprising a battery thyristor 1, a battery module 3, an input filter circuit 4, an output filter module 7, a secondary power input 8 (e.g., a generator), a primary power input 9 (e.g., commercial power), an input voltage detection circuit 19, a control circuit 14, and a DC bus 20. The DC bus 20 may comprise an input converter module 5, a main capacitor module 2, and an output inverter module 6. In some embodiments, the UPS 10 may further comprise a current detecting circuit (not shown).

As illustrated in FIG. 1, the UPS 10 has a switch 11 for receiving input power from the primary power input 9, such as AC power from the power grid, a secondary power input 8 such as a generator, or a DC power source such as a battery 3. In some embodiments, the secondary power input 8 is a battery that provides power to the DC bus 20 through a chopper circuit (not shown). In certain embodiments, the switch 11 may be either a mechanical switch or a solid state switch. The switch 11 and the battery module 3 may be operably connected to the input of an input filter circuit 4. A thyristor 1 may be operably connected between the output of the battery module 3 and the input of the input filter circuit 4. In certain embodiments, the input filter 4 receives power from the primary power input 9, secondary power input 8, or the battery 3 and sends it to the DC bus 20 of the UPS 10. The main capacitor module 2 may be used for storing the energy for holding up the DC bus 30 voltage. In certain embodiments, the output inverter module 6 is connected to the input of the output filter module 7.

The control circuit 14 may comprise a central processing unit (CPU), a computer, a computer unit, a data processor, a microcomputer, microelectronics device, analog circuits, and a microprocessor to implement the above-described functionality. In some embodiments, the control circuit may include a memory 15, a CPU 16, a program counter (PC) 17 and an arithmetic logic unit (ALU) 18. The memory 15 may comprise one or more types of memory, including, but not limited to a read/write memory, read only memory (ROM), random access memory (RAM), DRAM, SRAM, and any combination thereof.

The input voltage detection circuit 19 may monitor and/or detect the input voltage. The current detecting circuit may monitor and/or detect input current, and may be coupled to the control circuit 14. The memory 15 may store data values received from the voltage detection circuit 19, the DC bus 20, the main capacitor 2, and any other suitable element.

Figure 2:
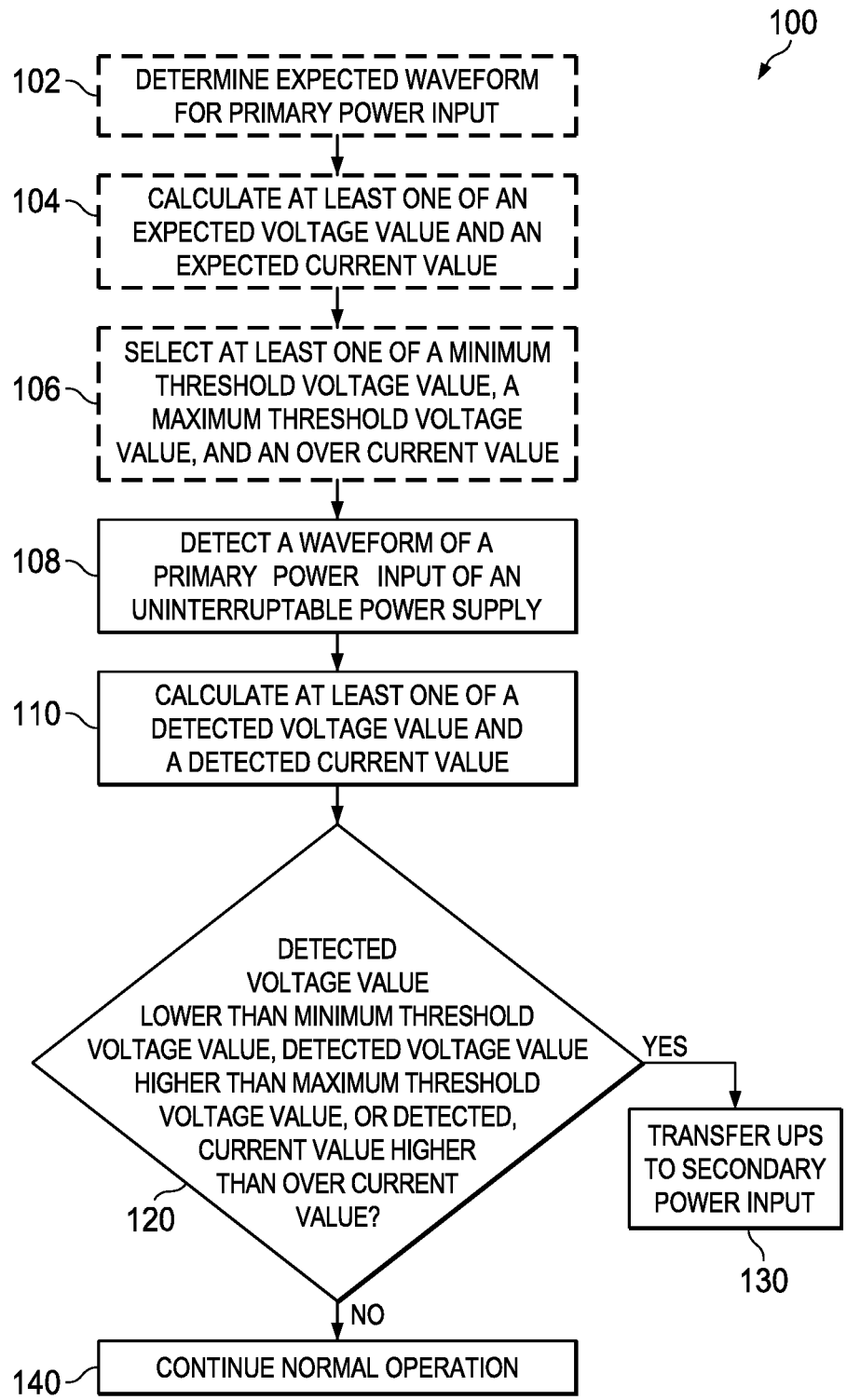
FIG. 2 is a process flow for detecting power failures, in accordance with an embodiment of the present disclosure.

FIG. 2 is a process flow 100 for detecting power failures, in accordance with an embodiment of the present disclosure. FIG. 2 is not meant to require any particular order in which the methods of the present disclosure must be performed, and any order of performing these steps is contemplated by the present disclosure and claims.

The process flow 100 may comprise detecting a waveform of a primary power input of an uninterruptable power supply 108. The detected waveform may, in certain embodiments, be a detected voltage waveform or a detected current waveform. In certain embodiments, the detected waveform is less than a half-cycle of the primary power input. In certain embodiments, the detected waveform is a quarter cycle or less of the primary power input. For example, in some embodiments, suitable detected waveforms include, but are not limited to $\frac{1}{3}$, $\frac{1}{4}$, $\frac{1}{5}$, $\frac{1}{6}$, $\frac{1}{7}$, $\frac{1}{8}$, $\frac{1}{9}$, $\frac{1}{10}$, $\frac{1}{11}$, $\frac{1}{12}$, $\frac{1}{13}$, $\frac{1}{14}$, $\frac{1}{15}$, and $\frac{1}{16}$ of a complete cycle of the primary power input. In certain embodiments, the use of detected waveforms comprising smaller portions of a cycle in the process flow 100 may, depending on the sampling rate, require greater computational effort. In certain embodiments, the detected waveform may be detected using an input voltage detection circuit (19 in FIG. 1), a current detecting circuit, or similar.

In some embodiments, the detected waveform may be detected based, at least in part, on the frequency or period of a waveform of the primary power input. Although the present disclosure refers generally to the use of frequency, a person of ordinary skill in the art would understand that the period of the primary power input could be used in place of frequency. The frequency or period of the primary power input may be constant or may vary over time. In some embodiments, the frequency or period of the primary power input may used to determine a predicted duration of the detected waveform. The predicted duration may be used to detect the detected waveform. For example, for a primary power input with a voltage waveform period of 20 ms, a $\frac{1}{4}$ cycle detected voltage waveform may be detected based, at least in part, on a 5 ms predicted duration. In some embodiments, the predicted duration may be a number of samples.

The frequency or period of the primary power input may be known, measured, or detected. In some embodiments, the frequency or period of the voltage waveform of the primary power input is measured regularly, for example, by the input voltage detection circuit (19 in FIG. 1). In certain embodiments, the detected waveform may be detected based, at least in part, on a frequency or period of a previous cycle of the primary power input. In some embodiments, the steps of process flow 100 may be repeated, and each detected waveform may be detected based, at least in part, on the frequency or period of the previous primary power input cycle.

In certain embodiments, the frequency or period of the primary power input may be determined based, at least in part, on a zero cross of a cycle of a primary power input waveform. A zero cross of a cycle may be the point where a sample of the waveform is zero or where the waveform has passed through zero, in either the positive or negative direction. For example, the duration and/or number of samples between zero crosses may represent the duration of a $\frac{1}{2}$ cycle of a waveform of the primary power input. The period of the waveform of the primary power input may be calculated, for example, by doubling the duration of a $\frac{1}{2}$ cycle.

In some embodiments, the process flow 100 may comprise sampling a waveform of the primary power input at one or more sampling rates. In certain embodiments, each of the one or more samples may be tested for a zero cross. When a zero cross is detected, a frequency of the primary power input may be determined. Noise in the system may occasionally result in one or more false zero crosses. In some embodiments, hysteresis may be used to account for false zero crosses. In certain embodiments, the duration or the number of samples since the last zero cross may indicate whether or not a detected zero cross is valid. For example, for each detected zero cross, the control circuit (14 in FIG. 1) may determine the number of samples since the last zero cross. In some embodiments, the number of samples since the last zero cross may be compared to a threshold zero cross sample count. In certain embodiments, if the number of samples since the last zero cross exceeds the threshold zero cross sample count, the zero cross may be considered valid. In some embodiments, if the number of samples since the last zero cross is less than the threshold zero cross sample count, the zero cross may be considered noise and may be ignored. In some embodiments, this could be accomplished by an algorithm. For example, a counter variable may be incremented with each sample taken since a valid zero cross, and the counter variable may be compared to the threshold zero cross sample count upon each zero cross detection.

In some embodiments, a predicted number of samples per cycle may be used to detect the detected waveform. For example, a predicted number of samples per $\frac{1}{4}$ cycle may be determined based, at least in part, on a previously detected zero cross or other method of measurement. For example, in certain embodiments, the predicted number of samples per $\frac{1}{4}$ cycle may be selected by halving the number of samples between two previous zero crosses. The predicted number of samples per $\frac{1}{4}$ cycle may be used to detect the detected waveform of a primary power input.

In some embodiments, detecting smaller portions of a primary power input waveform may provide earlier power detection. For example, in certain embodiments, a UPS using a detected waveform comprising ¼ of a cycle may detect a power failure earlier than a UPS using a detected waveform comprising ½ of a cycle. Earlier power failure detection may, in certain embodiments, provide quicker transfer from the primary input voltage to a secondary input voltage (e.g., a backup power supply) in the event of a power failure or a power abnormality. In some embodiments, quicker transfer to backup power supply may allow for a DC bus capacitor with less capacitance to be used. For example, a UPS using a detected waveform that is a half-cycle of the primary power input may require a larger DC bus capacitor than a UPS using a detected waveform that is a quarter cycle of the primary power input.

In some embodiments, the process flow 100 may comprise calculating at least one of a detected voltage value and a detected current value 110. In some embodiments, the detected voltage value and/or the detected current value may be calculated based, at least in part, on the detected waveform. For example, in certain embodiments, the detected voltage value or the detected current value may be calculated by at least one of a root mean square, an average, or a summation of the detected waveform. In certain embodiments, the detected waveform is sampled prior to calculating the root mean square, the average, and/or the summation of the detected waveform. A root mean square (RMS) may be the square root of the mean value of the squared function of the instantaneous values. For a cyclically alternating electric current, RMS may be equal to the value of the direct current that would produce the same power dissipation in a resistive load.

In some embodiments, the detected voltage value or detected current value may be calculated incrementally. For example, in certain embodiments, the detected waveform may comprise one or more samples taken at one or more sampling rates. In certain embodiments, the RMS value for the detected waveform may be calculated by squaring each sample and adding it to the squares of the previous samples taken of the detected waveform. Once all of the samples of the detected waveform have been taken and the squares added together, the RMS may be determined by calculating the square root of the sum of the squares divided by the number of samples of the detected waveform. As described above, the predicted duration and/or the number of samples of a detected waveform may be determined based, at least in part, on the frequency or period of the primary power input waveform. In some embodiments, the predicted duration and/or the number of samples of a detected waveform may be determined based on the zero cross. For example, once a zero cross is determined to be valid (as discussed above), the number of samples since the last valid zero cross may represent the number of samples in a ½ cycle. The number of samples in a ½ cycle may then be used to determine the number of samples needed to calculate the RMS value for the detected waveform.

In some embodiments, the process flow 100 may comprise calculating the RMS value for each ¼ cycle of the primary power input voltage waveform based on both the predicted number of samples per ¼ cycle and the zero cross. For example, after a valid zero cross has been detected, the process 100 may comprise incrementally summing the squares for each sample taken after the zero cross (as described above), until the predicted number of samples per ¼ cycle have been taken. At that point, the RMS for that ¼ cycle may be determined by calculating the square root of the sum of the squares divided by the number of samples taken. For the next ¼ cycle of the voltage waveform, the process may comprise sampling the waveform and incrementally summing the squares for each sample until a new valid zero cross is detected. The RMS may then be calculated based on the number of samples since the previous RMS calculation. The number of samples since the previous RMS calculation may then be used as the predicted number of samples per ¼ cycle for the next iteration.

In some embodiments, the detected voltage value, the detected current value, or both are determined 110 by calculating an average of the detected waveform. A person of skill in the art with the benefit of the present disclosure will appreciate that any suitable averaging method may be used. For example, determining the average of the detected waveform may comprise determining the quotient of the area under the waveform with respect to time. In some embodiments, determining the average may comprise determining all the instantaneous values along a time axis with time being one full period. In certain embodiments, the detected voltage value, the detected current value, or both may be calculated by summation. Summation may comprise the sum of all the instantaneous values of the detected waveform.

In some embodiments, the process flow 100 may comprise determining an expected waveform for the primary power input 102. In some embodiments, an expected waveform may comprise an expected current waveform or an expected voltage waveform. In some embodiments, an expected waveform for the primary power input may be known. An expected waveform for the primary power input may be determined, for example, based on tabulated data, experimental data, historical data, detected data, averaged data, or any other suitable information.

In some embodiments, the process flow 100 may comprise calculating at least one of an expected voltage value and an expected current value 104. In certain embodiments, the expected voltage value, the expected current value, or both are determined by calculating at least one of the root mean square, average, or summation of at least a portion of the expected voltage or current waveform. In certain embodiments, the expected values may be calculated by the same or a different method than the detected values. In some embodiments, the expected waveform comprises the same portion of a cycle as the detected waveform. For example, in certain embodiments, both the expected voltage waveform and the detected voltage waveform may comprise ¼ of a primary power input voltage cycle.

In some embodiments, the process flow 100 may comprise determining at least one of the minimum threshold voltage value, the maximum threshold voltage value, and the over current value 106. For example, in certain embodiments, at least one of the minimum threshold voltage value, the maximum threshold voltage value, and the over current value may be determined based, at least in part, on an expected voltage or current value for the primary power input. In some embodiments, the minimum threshold voltage value and/or maximum threshold voltage value may be selected 106 based, at least in part, on the expected voltage value. In some embodiments, the over current value may be selected based, at least in part, on the expected current value. In certain embodiments, the maximum threshold voltage value and/or the minimum threshold voltage value may be determined relative to the expected voltage value. For example, a suitable maximum threshold voltage value for certain embodiments of the present disclosure may be selected as a value 5 percent, 10 percent, 15 percent, 20 percent, 25 percent, 30 percent, 35 percent, or any other suitable amount higher than the expected voltage value. In certain embodiments, the maximum threshold voltage value is at least 15 percent higher than the expected voltage value. For example, a suitable minimum threshold voltage value for certain embodiments of the present disclosure may be selected as a value 5 percent, 10 percent, 15 percent, 20 percent, 25 percent, 30 percent, 35 percent, or any other suitable amount lower than the expected voltage value. In certain embodiments, the minimum threshold voltage is at least 15 percent lower than the expected voltage value.

In certain embodiments, the over current value may be determined relative to the expected current value. A suitable over current value for certain embodiments of the present disclosure may be selected as a value 5 percent, 10 percent, 15 percent, 20 percent, 25 percent, 30 percent, 35 percent, or any other suitable amount higher than the expected current value. In some embodiments, the over current value is at least 15 percent higher than the expected current value.

In certain embodiments, the process flow 100 may comprise transferring the uninterruptable power supply to a secondary power input 130 in response to a particular condition. For example, in some embodiments, the process flow 100 may comprise transferring the uninterruptable power supply to a secondary power input 130 if the detected voltage value is higher than a maximum threshold voltage value or if the detected current value is higher than an over current value 120. In certain embodiments, the detected voltage value exceeding the maximum threshold voltage value or the detected current value exceeding the over current value may indicate a power failure or power abnormality. In some embodiments, the process flow 100 may comprise transferring the uninterruptable power supply to a secondary power input 130 if the detected voltage value is lower than a minimum threshold voltage value 120. In certain embodiments, the detected voltage value dropping below a minimum threshold voltage value may indicate a power failure or power abnormality.

In some embodiments, the process flow 100 may comprise transferring the uninterruptable power supply to a secondary power input 130 in response to at least one of the following conditions: the detected voltage value is lower than a minimum threshold voltage value, the detected voltage value is higher than a maximum threshold voltage, or the detected current value is higher than an over current value.

In certain embodiments, the process flow 100 may comprise continuing normal operation of the UPS 140 if the detected voltage value is lower than the maximum threshold voltage value and/or higher than the minimum threshold voltage value. In certain embodiments, the process flow 100 may comprise continuing normal operation of the UPS 140 if the detected current value is lower than the over current value. In some embodiments, one or more steps of the process flow 100 may be repeated. For example, in certain embodiments, detecting a waveform of the primary power input 108, calculating at least one of the detected voltage value and the detected current value 110, and comparing at least one of the detected values to the minimum threshold voltage value, the over current value, or the maximum threshold voltage value 120 may be repeated periodically. Referring to FIG. 1, the control circuit 14 may be configured to perform one or more steps of the process flow 100 of FIG. 2, including, but not limited to determining an expected waveform, detecting a waveform of the primary power input, calculating at least one of the detected voltage value and the detected current value, and transferring the uninterruptable power supply to a secondary power input. In some embodiments, the memory 15 may store one or more values related to the process of FIG. 2, including, but not limited to expected voltage values, expected current values, minimum threshold voltage values, maximum threshold voltage values, and/or over current values.

Figure 3:
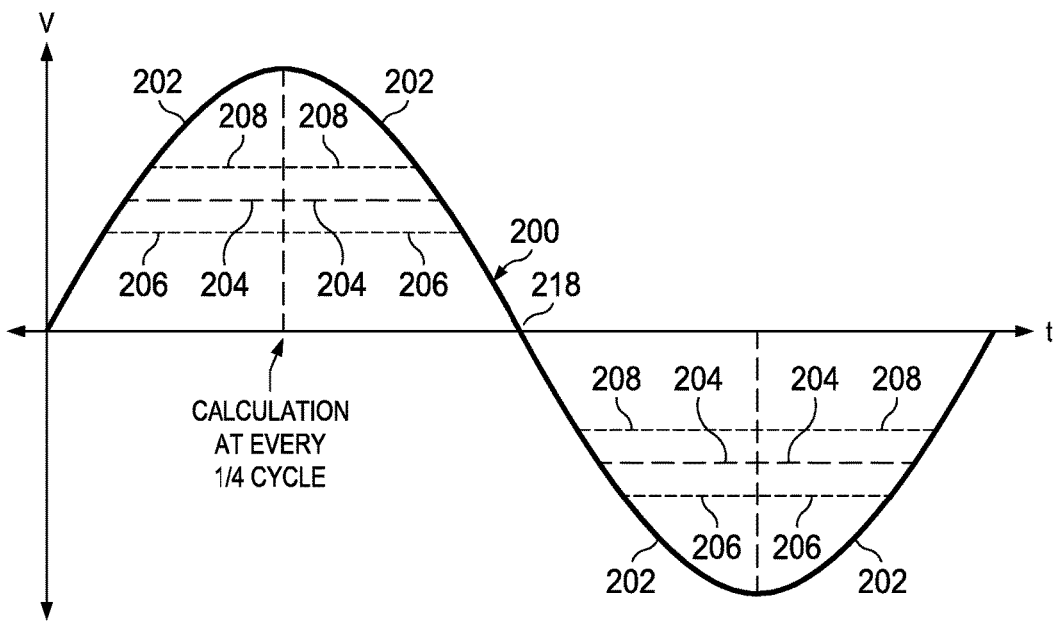
FIG. 3 is a graph of a primary power input voltage waveform split into ¼ portions in accordance with an embodiment of the present disclosure.

FIG. 3 is a graph of a primary power input voltage waveform 200 split into ¼ portions 202 in accordance with an embodiment of the present disclosure. As depicted, FIG. 3 shows a full voltage cycle of the primary power input 200 with a zero cross 218. In some embodiments, the detected voltage waveform may be one of the ¼ portions 202. In certain embodiments, one or more expected voltage values 204 may be calculated for one or more ¼ portions 202 of the primary power input cycle 200. In certain embodiments, one or more minimum threshold voltage values 206 and one or more maximum threshold voltage values 208 may be determined based, at least in part, on the one or more expected voltage values 204.

Figure 4:
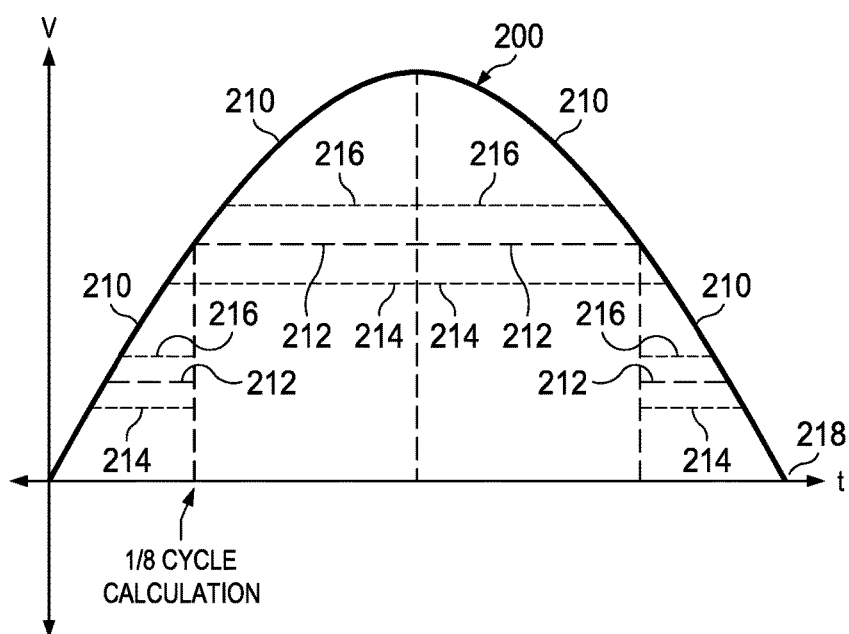
FIG. 4 is a graph of a portion of a primary power input voltage waveform split into ⅛ portions in accordance with an embodiment of the present disclosure.

FIG. 4 is a graph of a portion of a primary power input voltage waveform 200 split into ⅛ portions 210 in accordance with an embodiment of the present disclosure. In certain embodiments, the detected voltage waveform may be one of the ⅛ portions 210 of the primary power input cycle 200. In certain embodiments, one or more expected voltage values 212 may be calculated for one or more ⅛ portions 210 of the primary power input cycle 200. In certain embodiments, one or more minimum threshold voltage values 214 and/or one or more maximum threshold voltage values 216 may be determined based, at least in part, on the one or more expected voltage values 212.

Although the present disclosure and its advantages have been described in detail, it should be understood that various changes, substitutions and alterations can be made herein without departing from the spirit and scope of the disclosure as defined by the following claims.

What is claimed is:

1. A method comprising:
   determining an expected waveform for the primary power input;
   determining at least one of an expected voltage value and an expected current value based, at least in part, on the expected waveform by calculating at least one of a root mean square, an average, or a summation of at least a portion of the expected waveform;
   selecting at least one of a minimum threshold voltage value, a maximum threshold voltage value, or an over current value based, at least in part, on the expected voltage value or the expected current value;
   detecting at least a portion of a waveform of a primary power input of an uninterruptable power supply, wherein the detected waveform is less than a half-cycle of the waveform of the primary power input;
   calculating at least one of a detected voltage value and a detected current value, based, at least in part, on the detected waveform by calculating at least one of a root mean square, an average, or a summation of the detected waveform; and
   transferring the uninterruptable power supply to a secondary power input in response to at least one of the following conditions: the detected voltage value is lower than the minimum threshold voltage value, the detected voltage value is higher than the maximum threshold voltage, or the detected current value is higher than the over current value.

2. The method of claim 1, wherein the minimum threshold voltage value is at least 15 percent lower than the expected voltage value.

3. The method of claim 1, wherein the maximum threshold voltage value is at least 15 percent higher than the expected voltage value.

4. The method of claim 1, wherein the detected waveform is detected based, at least in part, on a frequency or period of the waveform of the primary power input.

5. The method of claim 1, wherein the detected waveform is detected based, at least in part, on a zero cross of the waveform of the primary power input.

6. The method of claim 1, wherein detecting the detected waveform comprises determining a duration of the detected waveform based, at least in part, on a previous cycle of the primary power input.

7. The method of claim 1, further comprising sampling the detected waveform and calculating at least one of the detected voltage value and the detected current value based, at least in part, on the sampled detected waveform.

8. The method of claim 1, wherein the primary power input is commercial AC power from a power grid.

9. The method of claim 1, wherein the secondary power input is a generator.

10. The method of claim 1, wherein the uninterruptable power supply comprises a DC bus and the secondary power input is a battery that provides power to the DC bus through a chopper circuit.

11. The method of claim 1, wherein the detected waveform is one quarter of a cycle of the primary power input waveform.

12. The method of claim 1, wherein the steps of detecting and calculating are repeated.

13. The method of claim 1, wherein a DC bus supplies energy to the uninterruptable power supply during the transfer from the primary power input to the secondary power input.

14. An uninterruptable power supply comprising:
    a primary power input for the uninterruptable power supply;
    a secondary power input for the uninterruptable power supply;
    an input voltage detection circuit and a current detection circuit for detecting the primary power input;
    a DC bus comprising a main capacitor module for supplying energy during a transfer between the primary power input and the secondary power input; and
    a control circuit configured to:
        determine an expected waveform for the primary power input;
        determine at least one of an expected voltage value and an expected current value based, at least in part, on the expected waveform by calculating at least one of a root mean square, an average, or a summation of at least a portion of the expected waveform;
        select at least one of a minimum threshold voltage value, a maximum threshold voltage value, or an over current value based, at least in part, on the expected voltage value or the expected current value;
        using at least one of the input voltage detection circuit and the current detection circuit, detect at least a portion of a waveform of the primary power input, wherein the detected waveform is less than a half-cycle of the waveform of the primary power input;
        calculate at least one of a detected voltage value and a detected current value based, at least in part, on the detected waveform by calculating at least one of a root mean square, an average, or a summation of the detected waveform; and
        transfer the uninterruptable power supply to the secondary power input in response to at least one of the following conditions: the detected voltage value is lower than the minimum threshold voltage value, the detected voltage value is higher than the maximum threshold voltage, or the detected current value is higher than the over current value.

15. The uninterruptable power supply of claim 14, wherein the control circuit is further configured to repeatedly detect the at least a portion of the waveform of the primary power input and calculate the at least one of the detected voltage value and the detected current value.

16. A method comprising:
    determining an expected waveform for the primary power input;
    determining at least one of an expected voltage value and an expected current value based, at least in part, on the expected waveform by calculating at least one of a root mean square, an average, or a summation of at least a portion of the expected waveform;
    selecting at least one of a minimum threshold voltage value, a maximum threshold voltage value, or an over current value based, at least in part, on the expected voltage value or the expected current value;
    detecting at least a portion of a waveform of a primary power input of an uninterruptable power supply, wherein the detected waveform is a quarter-cycle or less of the waveform of the primary power input;
    calculating at least one of a detected voltage value and a detected current value based, at least in part, on the detected waveform by calculating at least one of a root mean square, an average, or a summation of the detected waveform; and
    transferring the uninterruptable power supply to a secondary power input in response to at least one of the following conditions: the detected voltage value is lower than the minimum threshold voltage value, the detected voltage value is higher than the maximum threshold voltage, or the detected current value is higher than the over current value.

17. The method of claim 16, wherein the steps of detecting and calculating are repeated.

* * * * *